US009366851B2

(12) United States Patent
Dougherty et al.

(10) Patent No.: US 9,366,851 B2
(45) Date of Patent: Jun. 14, 2016

(54) DISPERSING IMMERSION LIQUID FOR HIGH RESOLUTION IMAGING AND LITHOGRAPHY

(71) Applicant: GE HEALTHCARE BIO-SCIENCES CORP., Piscataway, NJ (US)

(72) Inventors: William M. Dougherty, Kenmore, WA (US); Paul C. Goodwin, Shoreline, WA (US); Steven A. Reese, Shoreline, WA (US); David A. Stewart, Kirkland, WA (US)

(73) Assignee: GE HEALTHCARE BIO-SCIENCES CORP., Piscataway, NJ (US)

( * ) Notice: Subject to any disclaimer, the term of this patent is extended or adjusted under 35 U.S.C. 154(b) by 744 days.

(21) Appl. No.: 13/623,239

(22) Filed: Sep. 20, 2012

(65) Prior Publication Data
US 2013/0016328 A1    Jan. 17, 2013

Related U.S. Application Data

(63) Continuation of application No. 12/208,660, filed on Sep. 11, 2008, now abandoned.

(60) Provisional application No. 60/972,190, filed on Sep. 13, 2007, provisional application No. 60/972,193, filed on Sep. 13, 2007.

(51) Int. Cl.
*G02B 21/33* (2006.01)
*G03F 7/20* (2006.01)

(52) U.S. Cl.
CPC ............ *G02B 21/33* (2013.01); *G03F 7/70341* (2013.01)

(58) Field of Classification Search
CPC ..................................................... G02B 21/33
USPC .......... 359/362–398, 642, 656–661, 665–667
See application file for complete search history.

(56) References Cited

U.S. PATENT DOCUMENTS 7,388,648 B2 * 6/2008 Lof et al. ................... 355/53
7,403,293 B2   7/2008 Pellemans et al.
(Continued)

FOREIGN PATENT DOCUMENTS

DE      103 43 876          5/2005
JP          62158414 U    10/1987
(Continued)

OTHER PUBLICATIONS

Taiwan Search Report dated Apr. 30, 2013 issued on corresponding application No. 097135269.
Japanese Office Action for JP Application No. 2014-175202 mailed Jul. 2, 2015 (4 pages).

*Primary Examiner* — Derek S Chapel
(74) *Attorney, Agent, or Firm* — Sutherland Asbill & Brennan LLP

(57) ABSTRACT

Methods and apparatus are described for delivering index-matching immersion liquid in high numerical-aperture optical microscopy and lithography. An array of immersion liquid droplets is delivered to a specimen substrate or specimen substrate cover by an immersion liquid printing apparatus. An immersion liquid reservoir provides immersion liquid to the printer by a precision pump. The printer delivers immersion liquid to the substrate or substrate cover in arrays of immersion liquid droplets of defined volumes and array patterns. The volumes and patterns of array droplets delivered to the substrate or substrate cover are optimized to maintain adequate immersion liquid between the substrate or substrate cover and an immersion objective while avoiding the formation of air bubbles in the immersion liquid and the accumulation of excess volumes of immersion liquid.

29 Claims, 3 Drawing Sheets

(56) References Cited

U.S. PATENT DOCUMENTS

| | | |
|---|---|---|
| 2005/0084770 A1 | 4/2005 | Vollrath et al. |
| 2005/0152027 A1* | 7/2005 | Armstrong et al. ........... 359/366 |
| 2005/0259232 A1 | 11/2005 | Streefkerk et al. |
| 2006/0029104 A1 | 2/2006 | Jungck |
| 2006/0291041 A1 | 12/2006 | Berns |
| 2008/0259446 A1* | 10/2008 | Komatsu et al. .............. 359/391 |

FOREIGN PATENT DOCUMENTS

| | | |
|---|---|---|
| JP | 63118118 A | 5/1988 |
| JP | 2005-345726 A | 12/2005 |
| JP | 2007-062187 A | 3/2007 |

* cited by examiner

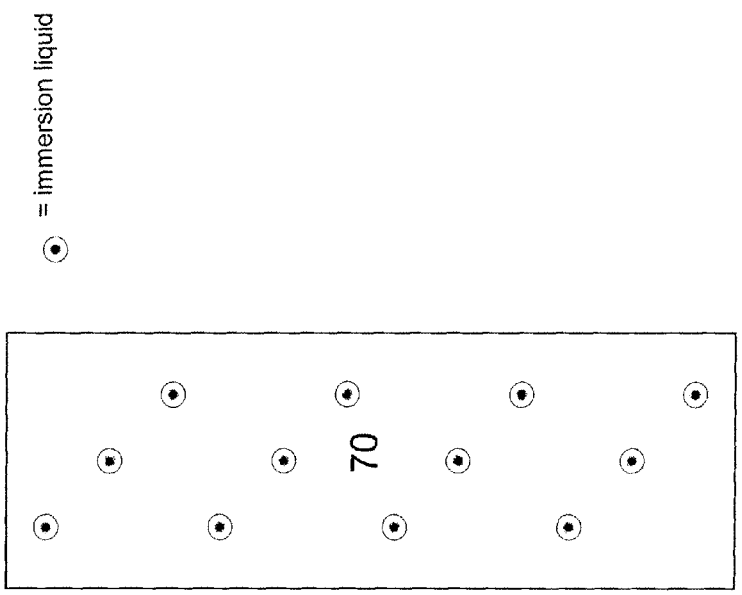

DISPERSING IMMERSION LIQUID FOR HIGH RESOLUTION IMAGING AND LITHOGRAPHY

CROSS-REFERENCE TO RELATED APPLICATIONS

The present application claims priority from U.S. Provisional Patent Application No. 60/972,190 filed Sep. 13, 2007 which is expressly incorporated herein by reference in its entirety.

BACKGROUND OF THE INVENTION

1. Field of the Invention

Aspects of the present invention relate generally to the field of microscopy, and more specifically, to methods and apparatuses for dispensing immersion liquid for high resolution microscopy and lithography.

2. Description of Related Art

In a conventional manual optical microscope utilizing an immersion objective, the specimen substrate may be situated on top of a microscope stage with the sample located on the upper surface of the substrate (e.g., a slide) typically underneath a substrate cover (e.g., a cover slip). The microscope objective may be located directly above the substrate cover. Prior to viewing a specimen with a high numerical aperture objective, the microscopist may manually dispense a small quantity of the immersion liquid on to the surface of the specimen substrate cover above the specific region of the specimen to be viewed. To access the specimen substrate cover, the user may be required to move the objective lens away from the region of interest. After the fluid is applied, the user restores the immersion objective to the region of interest, and gradually approaches the sample, thereby trapping the liquid between the sample and the objective. While it is possible to flood the entire sample field of an upright microscope with an immersion liquid, this is rarely desirable in practical microscopy.

If the microscopist desires to manually scan or image a large area of the specimen, this may necessitate a manual reapplication or replenishment of the immersion liquid. As the microscopist moves either the microscope objective or the microscope stage relative to the other over the large area of the microscope substrate, immersion liquid may be lost, for example, by evaporation, by adhesion to previously scanned regions of the substrate, or by other means. On large scans, eventually the volume of immersion liquid may become insufficient to properly couple the rays to and/or from the front lens of the objective. In this case, the operator of a manual microscope will typically pause, move the objective, reapply fluid, and restore the objective. With short working-distance high-NA objectives this requires withdrawing the objective from the proximity of the sample, thereby losing focus.

In an otherwise automated microscope system, the need to replenish the immersion liquid frustrates the complete automation of the system. Current options for automatically replenishing immersion liquids are plagued with difficulties associated with keeping air bubbles from forming in the immersion liquid. For example, some of the prior art teaches incorporating ultrasonic devices into the microscope or replenishing system to aid in bubble removal.

The above described problems become more exacerbated when utilizing immersion objectives with inverted microscope systems in which the specimen being observed is situated between the user and the objective lens. In these systems, the specimen substrate may again be situated on top of a microscope stage with the sample located on the upper surface of the substrate, but, in an inverted system, the objective is positioned underneath the specimen substrate pointing up. If the microscopist is utilizing an immersion objective, the immersion liquid is typically deposited on to the surface of the upper-most lens of the immersion objective. Adding immersion liquid to the immersion objective therefore requires the ability to access to the top of the objective or alternatively to moving the objective into and out of the light path. Both methods may pose problems and limitation in the configuration of the inverted microscope and often result in restricting the possible travel of the optical system. Additionally, because the immersion liquid is typically applied directly to the objective lens, the inverted configuration increases the risk that liquid may enter the body of the objective. Sloppy microscopists frequently ruin expensive objectives by over-application of liquid. It should be noted that the above discussed problems relating to dispensing immersion liquids in viewing and imaging systems, also exists for high resolution lithography systems.

What is needed in the field is a method and apparatus that facilitates the viewing of specimens with immersion objectives that avoids the problems related to replenishment of the immersion liquid.

BRIEF SUMMARY OF THE INVENTION

In certain embodiments, immersion fluid replenishment may be optimized to facilitate viewing and imaging of large specimen areas by dispersing immersion liquid precisely and directly on to a substrate or substrate cover. A substrate or substrate cover can be provided and an array of immersion liquid droplets can be dispensed or printed on to the surface of the substrate or substrate cover. The printed substrate or substrate cover may be utilized in conjunction with a high aperture objective to view a large specimen area without further manipulation of the instrument or further replenishment of the immersion liquid.

BRIEF DESCRIPTION OF THE DRAWINGS

FIG. 3 is an image of an example of an immersion liquid printed substrate.

DETAILED DESCRIPTION OF THE INVENTION

Figure 1:
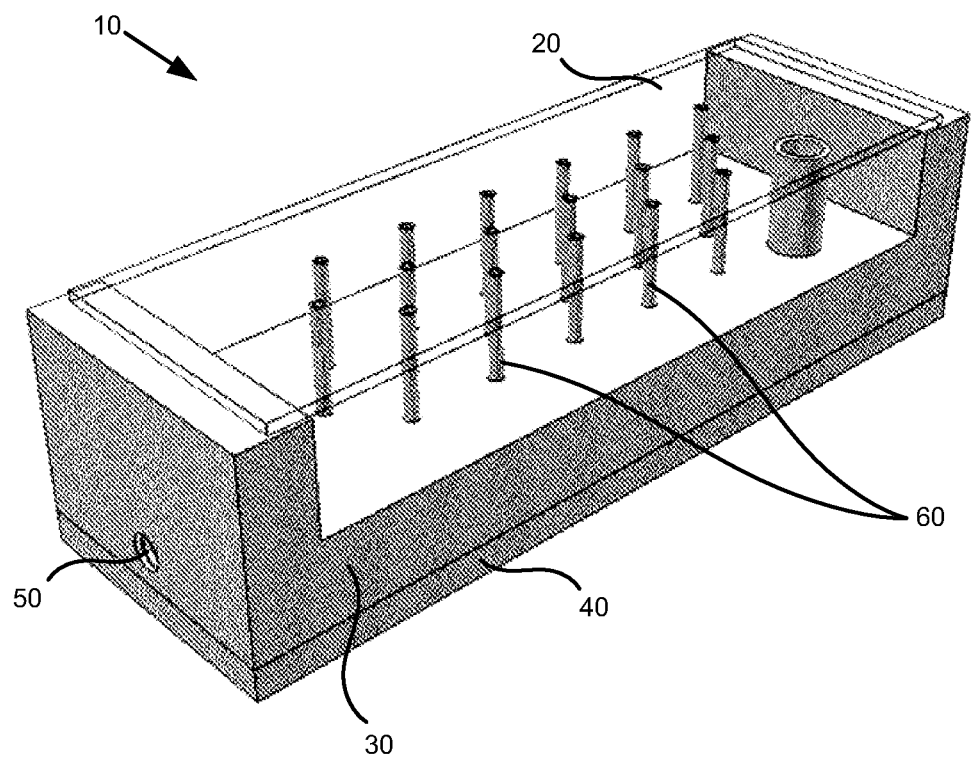
FIG. 1 is a schematic representation of an example of an immersion liquid printer.

Embodiments of the present invention will now be described in detail with reference to the drawings, which are provided as illustrative examples so as to enable those skilled in the art to practice the invention. Notably, the figures and examples below are not meant to limit the scope of the present invention to a single embodiment, but other embodiments are possible by way of interchange of some or all of the described or illustrated elements.

Resolution of a microscope is dictated by the numerical aperture (NA) of the objective, expressed as NA=n sin $\theta$, where n is the index of refraction of the working medium, and $\theta$ is the half-angle of the cone of light that can enter the objective. Objectives using air as the working medium (n≈1) are limited to an NA of approximately 1.0 ($\theta$≈90°). Substantial improvements in NA and thus resolution can be achieved by displacing air with a transparent fluid, such as oil, with an index n>1. High numerical aperture objectives can be designed to work with a fluid typically comprise an immersion objective that may be operated such that a liquid that spans or bridges the space between the objective front surface and the microscope specimen, forming an immersion liquid column. The immersion liquid can comprise water, glycerin and/or a specialized oil selected for use with an immersion objective. For example, a high-magnification oil immersion objective may employ an immersion liquid with a refractive index of 1.516 to match the refractive index of a front lens of the objective and to achieve a working numerical aperture of 1.40.

Certain embodiments of the invention support immersion microscopy by providing a plurality of immersion liquid drops, spots or droplets on a substrate or substrate cover such that a microscope objective can be moved between drops, spots and droplets without compromising the integrity of the drops, spots and droplets at which the objective is placed. Thus for example, an array or pattern of droplets may be printed or otherwise deposited upon a substrate of an optical microscope comprising an immersion objective. The specimen substrate can be situated atop a microscope stage and a sample positioned on an upper surface of the substrate and beneath a substrate cover. The immersion objective may be located directly above the substrate cover and positioned over one of the array of droplets. The droplets are configured to align with areas of interest in the sample. The droplets typically comprise a material having a high refractive index with respect to air and the material may be a liquid or gel.

Certain embodiments of the invention provide systems and methods for printing an array of immersion liquid droplets onto a specimen substrate or specimen substrate cover. Certain embodiments of the invention provide numerous advantages and addresses and resolves various issues associated with conventional systems; for example, certain embodiments of the invention overcome the above described problems related to replenishing immersion liquid when using a high numerical aperture immersion objective. More specifically, by spacing the immersion liquid droplets at appropriate intervals across a specimen substrate or specimen substrate cover, certain embodiments of the invention avoid the formation of air bubbles in the immersion liquid and the accumulation of excess, instrument damaging amounts of immersion liquid. By selectively locating the droplets of immersion liquid, the array of droplets can be optimized for both the scan area and the scan pattern of the microscope or imaging instrument. It will be appreciated that small droplets adhering to a surface can be quite stable because of surface-tension and droplet-surface effects, even in an inverted geometry.

Figure 2:
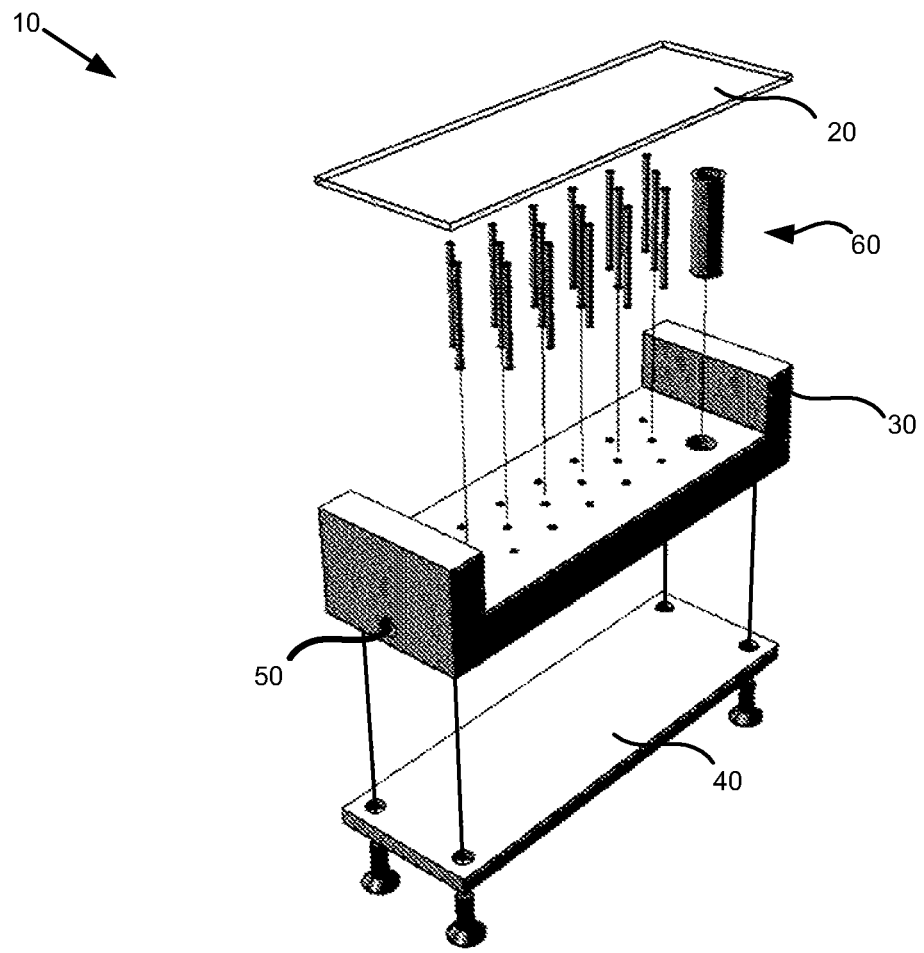
FIG. 2 is an exploded schematic representation of an example of an immersion liquid printer.

With reference to FIGS. 1 and 2, certain embodiments of the present invention provide a printer 10. Printer 10 can comprise a base 30 that may be operable to support a specimen substrate or specimen substrate cover (hereinafter collectively referred to as a "substrate"). Printer 10 may further comprise a series of specifically sized tubes or ducts 60 located such as to deliver droplets of immersion liquid to a surface of substrate 20. Base 30 may comprise port 50 and be attached to base plate 40.

In practice, substrate 20 may be placed upon or within base 30 such that the surface of substrate 20 requiring application of immersion liquid is oriented proximate to ducts 60. A precision metering pump can be activated to pump immersion liquid from an immersion liquid reservoir (pump and immersion liquid reservoir not shown). The immersion liquid may be pumped into printer 10 through port 50 such that the flow of the immersion liquid can be divided between ducts 60. The precision pump may be utilized to control the specific volumes of the immersion liquid delivered to and dispensed upon the surface of substrate 20. By specifically locating ducts 60 relative to one another, as well as to the relative area of the substrate, the array of drops can be optimized for both the scan area and the pattern of the scan.

In certain embodiments of the present invention, printer 10 may be external to the imaging system and utilization of these embodiments may require no modification to a microscope or imaging instrument. Embodiments of the invention can be effectively configured for use with conventional or inverted and manual or automated instruments. Prior to immersion liquid printing, the microscopist typically determines whether conventional or inverted equipment is to be used and can print accordingly. For example, the top of the specimen substrate cover may be printed in the case of conventional microscopes and the bottom of the specimen substrate may be printed in the case of inverted microscopes.

Certain embodiments of the invention may be incorporated into a particular conventional or inverted microscope or imaging instrument, thus providing for the automation of both the substrate printing and imaging. Such embodiments may utilize means, such as robotics, precision actuators, computer processors, and instructional software, to move and position the substrate for printing and viewing.

As depicted in FIGS. 1 and 2, ducts 60 may comprise individually fabricated hollow cylinders that may be embedded or otherwise attached to base 30. In certain embodiments, ducts 60 may be formed within base 30 by fabricating individual openings in base 30, thus requiring no additional structures for delivery of the immersion liquid droplets from base 30 to substrate 20. Ducts 60 have been depicted as circular in the examples presented although ducts 60 can be constructed in a variety of forms and shapes, including for example, square, oval, linear and triangular shapes. The resulting immersion liquid droplets may be accordingly shaped or, depending of the surface tension characteristics of the liquid, assume a shape distinct from the shape of the duct from which the liquid was dispensed. Certain embodiments of the present invention may utilize immersion liquids such as water, glycerol, and hydro-carbon and synthetic oils.

As depicted in FIGS. 1 and 2, ducts 60 may comprise dissimilar sizes or shapes. FIGS. 1 and 2 show a single larger diameter duct among the otherwise uniform smaller ducts. In certain embodiments of the present invention, it may be advantageous to provide a large immersion liquid droplet to serve as a starting point for the imaging or scanning of the specimen.

FIGS. 1 and 2 show a staggered hash pattern of ducts 30. FIG. 3 shows an array of immersion droplets 70 in a staggered hash pattern resulting from printing by a staggered hash pattern of ducts 30. It should be noted that the immersion liquid array pattern is not limited to staggered hash patterns but can be designed and optimized for the scan direction and method. For example, immersion liquid arrays may comprise of two of more immersion liquid droplets or lines or other shapes in a regular grid of columns, rows, diagonals, purely random array patterns and/or in any other pattern that may be appropriate for the scanning requirements.

In certain embodiments, immersion liquid droplets may be printed on the substrate in an "on-demand" manner. For example, two or more ducts can be used to place immersion liquid in the direction of the next movement or scan during imaging and as the sample is moved relative to the lens. In certain embodiments, the printer may be incorporated into the microscope or imaging instrument in order to coordinate viewing and dispensing steps.

Certain of the components comprising printer 10 may be fabricated of any suitable material or combination of materials including metal, alloy, plastics and glass. The materials may be chosen based on their individual characteristics including, for example, rigidity, corrosion resistance, ease of fabrication and cost.

It is contemplated that, in certain embodiments, alternative methods may be used for printing an immersion liquid pattern onto a substrate. For example, immersion liquid printing techniques analogous to those used in the ink printing industry can be used where these techniques may include use of a thermal inkjet printer, a piezoelectric ink jet and/or continuous inkjet printing.

In certain embodiments, immersion fluid can be delivered to a substrate as droplets in a fine mist. The mist may be produced by an ultrasonic nebulizer or by other suitable means. A mist technique typically requires no contact between the fluid applicator and the substrate, and may operate during the imaging process, continuously refreshing the immersion fluid. When used continuously or intermittently, the flowing mist applies only the tiniest of forces to the substrate, and thus will not displace the substrate, which otherwise could potentially upset the imaging focus. Entrained air bubbles may be eliminated through judicious nebulizer design and operation.

Additional Descriptions of Certain Aspects of the Invention

Certain embodiments of the invention provide a system for providing immersion liquid comprising a substrate, an immersion liquid, and a printer operable to disperse an array of droplets of said immersion liquid on to a surface of said substrate. In some of these embodiments, the substrate comprises a specimen substrate. In some of these embodiments, the specimen substrate comprises a microscope slide. In some of these embodiments, the substrate comprises a specimen substrate cover. In some of these embodiments, the specimen substrate cover comprises a microscope slide cover. In some of these embodiments, the substrate is made of glass or plastic. In some of these embodiments, the printer is manually operable to provide droplets of an immersion liquid to said substrate. In some of these embodiments, the printer is operable to automatically provide droplets of an immersion liquid to said substrate. In some of these embodiments, the immersion liquid is selected from the group of immersion liquids comprising water, glycerol, and oil. In some of these embodiments, the printer employs a system of ducts. In some of these embodiments, the printer employs an ultrasonic nebulizer. In some of these embodiments, the printer employs a thermal printing element. In some of these embodiments, the printer employs a piezoelectric element.

Certain embodiments of the invention employ a method of providing immersion liquid to a substrate comprising the steps of providing a substrate and printing an array of immersion liquid droplets on a surface of said substrate. In some of these embodiments, the substrate comprises a specimen substrate. In some of these embodiments, the specimen substrate comprises a microscope slide or a multi-well plate. In some of these embodiments, the substrate comprises a specimen substrate cover. In some of these embodiments, the specimen substrate cover comprises a microscope slide cover. In some of these embodiments, the substrate is made of glass or plastic. In some of these embodiments, the providing is manual. In some of these embodiments, the providing is automated. In some of these embodiments, the immersion liquid is selected from the group of immersion liquids comprising water, glycerol, and oil. In some of these embodiments, the printing is manually controlled. In some of these embodiments, the printing is automatically controlled.

Certain embodiments of the invention include a system or method as described above, wherein the printing delivers said immersion liquid through ducts. In some of these embodiments, the printing delivers said immersion liquid through an ultrasonic nebulizer. In some of these embodiments, the printing delivers said immersion liquid by means of a thermal printing element. In some of these embodiments, the printer delivers said immersion liquid by means of a piezoelectric element.

Certain embodiments of the invention provide methods for preparing a specimen substrate. Some of these embodiments comprise printing an array of droplets onto the substrate, positioning the array of droplets relative to a specimen and contacting an objective to a selected one of the droplets, wherein the droplets comprise a substance having a high refractive index. In some of these embodiments, the substance includes a gel. In some of these embodiments, the substance includes a liquid. In some of these embodiments, the liquid includes water. In some of these embodiments, the liquid includes glycerol. In some of these embodiments, the liquid includes oil.

In some of these embodiments, the objective is an objective of a microscope. In some of these embodiments, the step of printing includes shaping the array of droplets. In some of these embodiments, shaping the array of droplets optimizes a scan area of the microscope. In some of these embodiments, shaping the array of droplets optimizes a scanning pattern of the microscope. In some of these embodiments, shaping the array of droplets is based on surface tension characteristics of the liquid. In some of these embodiments, the substance includes a liquid and shaping the array of droplets is based on surface tension characteristics of the liquid.

In some of these embodiments, printing an array of droplets includes dispensing a liquid through ducts and wherein shaping the array of droplets includes selecting a shape of a duct. In some of these embodiments, the microscope is an inverted imaging instrument. In some of these embodiments, the substrate comprises a microscope slide. In some of these embodiments, the substrate comprises a multi-well plate.

Certain embodiments of the invention provide a microscopy system comprising a high refractive index liquid, and a printer configured to print an array of drops of the liquid on to a surface of a substrate. In some of these embodiments, the array of drops provides a high refractive index interface for an immersion objective of a microscope. In some of these embodiments, the substrate comprises a specimen substrate. In some of these embodiments, the immersion liquid is selected from the group of immersion liquids comprising at least one of water, glycerol and oil. In some of these embodiments, the printer includes an ultrasonic nebulizer. In some of these embodiments, the printer includes a piezoelectric element.

Certain embodiments of the invention provide a microscopy system comprising an immersion objective configured to be positioned in contact one or more drops of a high refractive index liquid and a printer configured to print an array of drops of the liquid on to a surface of a substrate. In some of these embodiments, one or more of the array of drops are arranged to provide an interface between a specimen carried by the substrate and the immersion objective. In some of these embodiments, one or more drops provide high refractive index interfaces for the immersion objective of a microscope. In some of these embodiments, the liquid includes one or more of water, glycerol and oil. In some of these embodiments, the printer includes an ultrasonic nebulizer for dispersing the liquid, thereby forming the array of drops. In some of these embodiments, the printer includes a piezoelectric element includes an ultrasonic nebulizer for dispersing the liquid, thereby forming the array of drops.

Although the present invention has been described with reference to specific exemplary embodiments, it will be evident to one of ordinary skill in the art that various modifications and changes may be made to these embodiments without departing from the broader spirit and scope of the invention. Accordingly, the specification and drawings are to be regarded in an illustrative rather than a restrictive sense.

What is claimed is:

1. A method for immersion microscopy comprising:
depositing a replenishment-array of discrete immersion fluid droplets onto a surface of a substrate;
positioning an objective lens in immersion contact with the substrate surface through an immersion fluid volume; and
a scanning step of scanning the objective lens with respect to the substrate surface,
wherein the droplets of the replenishment-array are arranged such that they replenish the immersion fluid volume at the objective lens during the scanning step, and
wherein the droplets of the replenishment-array are deposited across the substrate surface in a non-localized manner with respect to the objective lens prior to the scanning step.

2. The method of claim 1, wherein the fluid includes a gel.

3. The method of claim 1, wherein the fluid includes a liquid.

4. The method of claim 3, wherein the liquid includes water.

5. The method of claim 3, wherein the liquid includes glycerol.

6. The method of claim 3, wherein the liquid includes oil.

7. The method of claim 1, wherein the array of droplets is arranged to optimize a scan area of the microscope.

8. The method of claim 1, wherein the array of droplets is arranged to optimize a scanning pattern of the microscope.

9. The method of claim 1, wherein the array of droplets is arranged based on surface tension characteristics of the liquid.

10. The method of claim 1, wherein depositing a replenishment array of immersion fluid droplets includes dispensing a liquid through ducts and wherein shaping the array of droplets includes selecting a shape of a duct.

11. The method of claim 1, wherein the microscope is an inverted imaging instrument.

12. The method of claim 1, wherein the substrate comprises a microscope slide.

13. The method of claim 1, wherein the substrate comprises a multi-well plate.

14. The method of claim 1, wherein the step of depositing a replenishment-array of immersion fluid droplets onto the substrate surface is performed external to the microscope system and prior to the step of positioning the objective lens in immersion contact with the substrate surface.

15. The method of claim 14, comprising the step of applying a large immersion fluid droplet to serve as starting point for the scanning; and wherein the step of positioning the objective lens in immersion contact with the substrate surface involves positioning the objective lens in contact with said large immersion fluid droplet.

16. A method for immersion lithography comprising:
depositing a replenishment-array of discrete immersion fluid droplets onto a surface of a substrate;
positioning an objective lens in immersion contact with the substrate surface through an immersion fluid volume; and
a scanning step of scanning the objective lens with respect to the substrate surface,
wherein the droplets of the replenishment-array are arranged such that they replenish the immersion fluid volume at the objective lens during the scanning step, and
wherein the droplets of the replenishment-array are deposited across the substrate surface in a non-localized manner with respect to the objective lens prior to the scanning step.

17. The method of claim 16, wherein the fluid includes a gel.

18. The method of claim 16, wherein the fluid includes a liquid.

19. The method of claim 18, wherein the liquid includes water.

20. The method of claim 18, wherein the liquid includes glycerol.

21. The method of claim 18, wherein the liquid includes oil.

22. The method of claim 16, wherein the array of droplets is arranged to optimize a scan area of the lithography system.

23. The method of claim 16, wherein the array of droplets is arranged to optimize a scanning pattern of the lithography system.

24. The method of claim 16, wherein the array of droplets is arranged based on surface tension characteristics of the liquid.

25. The method of claim 16, wherein depositing a replenishment array of immersion fluid droplets includes dispensing a liquid through ducts and wherein shaping the array of droplets includes selecting a shape of a duct.

26. The method of claim 16, wherein the lithography system is an inverted lithography instrument.

27. The method of claim 16, wherein the substrate comprises a lithography substrate.

28. The method of claim 16, wherein the step of depositing a replenishment-array of immersion fluid droplets onto the substrate surface is performed external to the lithography system and prior to the step of positioning the objective lens in immersion contact with the substrate surface.

29. The method of claim 28, comprising the step of applying a large immersion fluid droplet to serve as starting point for the scanning; and wherein the step of positioning the objective lens in immersion contact with the substrate surface involves positioning the objective lens in contact with said large immersion fluid droplet.

* * * * *